(12) United States Patent
Chen et al.

(10) Patent No.: US 12,119,416 B2
(45) Date of Patent: Oct. 15, 2024

(54) BUFFER LAYERS FOR PHOTOVOLTAIC DEVICES WITH GROUP V DOPING

(71) Applicant: First Solar, Inc., Tempe, AZ (US)

(72) Inventors: Le Chen, Fremont, CA (US); Sachit Grover, Campbell, CA (US); Jason Kephart, San Jose, CA (US); Sergei Kniajanski, Clifton Park, NY (US); Chungho Lee, San Jose, CA (US); Xiaoping Li, Santa Clara, CA (US); Feng Liao, Perrysburg, OH (US); Dingyuan Lu, San Jose, CA (US); Rajni Mallick, Fremont, CA (US); Wenming Wang, Toledo, OH (US); Gang Xiong, Santa Clara, CA (US); Wei Zhang, San Jose, CA (US)

(73) Assignee: First Solar, Inc., Tempe, AZ (US)

( * ) Notice: Subject to any disclaimer, the term of this patent is extended or adjusted under 35 U.S.C. 154(b) by 0 days.

(21) Appl. No.: 17/287,988

(22) PCT Filed: Oct. 23, 2019

(86) PCT No.: PCT/US2019/057542
§ 371 (c)(1),
(2) Date: Apr. 22, 2021

(87) PCT Pub. No.: WO2020/086646
PCT Pub. Date: Apr. 30, 2020

(65) Prior Publication Data
US 2021/0376177 A1 Dec. 2, 2021

Related U.S. Application Data

(60) Provisional application No. 62/866,665, filed on Jun. 26, 2019, provisional application No. 62/834,017, (Continued)

(51) Int. Cl.
*H01L 31/0216* (2014.01)
*H01L 31/0296* (2006.01)
*H01L 31/073* (2012.01)

(52) U.S. Cl.
CPC .. *H01L 31/02167* (2013.01); *H01L 31/02963* (2013.01); *H01L 31/073* (2013.01)

(58) Field of Classification Search
CPC ............ H01L 31/073; H01L 31/02963; H01L 31/0296; H01L 31/03925; H01L 31/02167
See application file for complete search history.

(56) References Cited

U.S. PATENT DOCUMENTS 8,748,214 B2 6/2014 DeLuca et al.
8,912,037 B2 12/2014 Johnson et al.
(Continued)

FOREIGN PATENT DOCUMENTS

CN 101790792 A 7/2010
CN 103346193 A 10/2013
(Continued)

OTHER PUBLICATIONS

International Search Report and Written Opinion, Application No. PCT/US2019/057542, dated Jan. 24, 2020.
(Continued)

*Primary Examiner* — Lindsey A Buck
(74) *Attorney, Agent, or Firm* — MacMillan, Sobanski & Todd, LLC

(57) ABSTRACT

According to the embodiments provided herein, a photovoltaic device can include a buffer layer adjacent to an absorber layer doped p-type with a group V dopant. The buffer layer can have a plurality of layers compatible with group V dopants.

24 Claims, 4 Drawing Sheets

Related U.S. Application Data filed on Apr. 15, 2019, provisional application No. 62/833,312, filed on Apr. 12, 2019, provisional application No. 62/749,934, filed on Oct. 24, 2018.

(56) References Cited

U.S. PATENT DOCUMENTS

| | | |
|---|---|---|
| 8,987,587 B2 | 3/2015 | Cheng et al. |
| 9,082,903 B2 | 7/2015 | Shao et al. |
| 9,153,730 B2 | 10/2015 | Buller et al. |
| 9,263,608 B2 | 2/2016 | Powell et al. |
| 9,276,154 B2 | 3/2016 | Damjanovic et al. |
| 9,318,642 B2 | 4/2016 | Gupta et al. |
| 9,362,423 B2 | 6/2016 | Beck et al. |
| 9,461,186 B2 | 10/2016 | Jayaraman et al. |
| 9,608,144 B2 | 3/2017 | Johnson et al. |
| 9,698,285 B2 | 7/2017 | Damjanovic et al. |
| 9,799,784 B2 | 10/2017 | Allenic et al. |
| 9,871,154 B2 | 1/2018 | Duggal et al. |
| 10,056,507 B2 | 8/2018 | Shao et al. |
| 10,062,800 B2 | 8/2018 | Blaydes et al. |
| 10,141,463 B2 | 11/2018 | Korevaar et al. |
| 10,141,473 B1 | 11/2018 | Blaydes et al. |
| 10,243,092 B2 | 3/2019 | Damjanovic et al. |
| 10,319,873 B2 | 6/2019 | Powell et al. |
| 10,461,207 B2 | 10/2019 | Damjanovic et al. |
| 10,529,883 B2 | 1/2020 | Damjanovic et al. |
| 10,784,397 B2 | 9/2020 | Blaydes et al. |
| 10,861,994 B2 | 12/2020 | Abken et al. |
| 11,158,749 B2 | 10/2021 | Grover et al. |
| 11,164,989 B2 | 11/2021 | Adreini et al. |
| 11,201,257 B2 | 12/2021 | Grover et al. |
| 11,342,471 B2 | 5/2022 | Grover et al. |
| 11,502,212 B2 | 11/2022 | Cao et al. |
| 11,588,069 B2 | 2/2023 | Andreini et al. |
| 11,695,085 B2 | 7/2023 | Jayamaha et al. |
| 11,769,844 B2 | 9/2023 | Damjanovic et al. |
| 11,784,278 B2 | 10/2023 | Andreini et al. |
| 11,791,427 B2 | 10/2023 | Grover et al. |
| 11,817,516 B2 | 11/2023 | Damjanovic et al. |
| 11,843,070 B2 | 12/2023 | Abken et al. |
| 11,876,140 B2 | 1/2024 | Blaydes et al. |
| 11,929,447 B2 | 3/2024 | Brubaker et al. |
| 2009/0194166 A1* | 8/2009 | Powell ............... H01L 31/1828 136/260 |
| 2011/0005594 A1 | 1/2011 | Powell et al. |
| 2011/0136294 A1 | 6/2011 | Eaglesham et al. |
| 2011/0139240 A1* | 6/2011 | Allenic ............... H01L 31/065 136/256 |
| 2011/0315221 A1 | 12/2011 | Hunt et al. |
| 2013/0008500 A1* | 1/2013 | Lin ...................... C03B 27/04 136/256 |
| 2013/0104985 A1 | 5/2013 | Korevaar et al. |
| 2013/0146133 A1 | 6/2013 | Lemmon et al. |
| 2013/0180579 A1 | 7/2013 | Jin et al. |
| 2014/0109965 A1* | 4/2014 | Goto .................... H01L 31/068 136/259 |
| 2015/0007890 A1* | 1/2015 | Xu ..................... H01L 31/1864 136/260 |
| 2016/0005916 A1 | 1/2016 | Cao et al. |
| 2020/0035844 A1 | 1/2020 | Grover et al. |
| 2020/0381567 A1 | 12/2020 | Cao et al. |
| 2021/0036178 A1 | 2/2021 | Grover et al. |
| 2021/0043794 A1 | 2/2021 | Brubaker et al. |
| 2021/0091250 A1 | 3/2021 | Abken et al. |
| 2021/0143288 A1 | 5/2021 | Grover et al. |

FOREIGN PATENT DOCUMENTS

| | | | |
|---|---|---|---|
| CN | 105914241 A | | 8/2016 |
| GB | 2466496 A | * | 6/2010 .......... H01L 31/065 |
| JP | 2012054493 A | | 3/2012 |
| WO | 2017210280 A1 | | 12/2017 |
| WO | 2018071509 A1 | | 4/2018 |

OTHER PUBLICATIONS

Japanese Patent Office Official Action, dated Oct. 25, 2021, Application No. 2021-522517. .
Japanese Office Action, dated May 26, 2022, for Application No. 2021-522517.
Japanese Notification of Reason(s) for Rejection, Application No. 2021-522517, dated Jan. 25, 2023.
Examination report, dated Dec. 8, 2022, Indian Patent Application 202117018085.
First Chinese Office Action, Application No. 201980086001.3, dated Jun. 8, 2023.
Chinese Second Office Action, Application No. 201980086001.3, dated Feb. 2, 2024.

* cited by examiner

BUFFER LAYERS FOR PHOTOVOLTAIC DEVICES WITH GROUP V DOPING

CROSS-REFERENCE TO RELATED APPLICATIONS

This is a national phase application of international application PCT/US2019/057542, filed Oct. 23, 2019, and published as WO/2020/086646 on Apr. 30, 2020. This application claims the benefit of U.S. application Ser. No. 62/749,934, filed under 35 U.S.C. § 111(b) on Oct. 24, 2018. This application claims the benefit of U.S. application Ser. No. 62/833,312, filed under 35 U.S.C. § 111(b) on Apr. 12, 2019. This application claims the benefit of U.S. application Ser. No. 62/834,017, filed under 35 U.S.C. § 111(b) on Apr. 15, 2019. This application claims the benefit of U.S. application Ser. No. 62/866,665, filed under 35 U.S.C. § 111(b) on Jun. 26, 2019. Each of the aforementioned applications is incorporated by reference in the entirety.

BACKGROUND

The present specification generally relates to photovoltaic devices having a buffer layer compatible with group V dopants and, more specifically, photovoltaic devices having a buffer layer compatible with group V dopants adjacent to an absorber layer doped p-type with a group V dopant.

A photovoltaic device generates electrical power by converting light into direct current electricity using semiconductor materials that exhibit the photovoltaic effect. Certain types of semiconductor material can be difficult to manufacture. For example, thin film layers provided adjacent to semiconductor material can lead to inoperability or instability of the photovoltaic device. The use of group V elements as a dopant for a p-type semiconductor material can be particularly difficult.

Accordingly, a need exists for alternative buffer layers for use with an absorber layer doped with a group V p-type dopant.

SUMMARY

The embodiments provided herein relate to photovoltaic devices having a buffer layer compatible with group V dopants. These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of photovoltaic devices having a buffer layer compatible with group V dopants are provided. Various embodiments of the photovoltaic device, as well as, methods for forming the photovoltaic device will be described in more detail herein.

Figure 1:
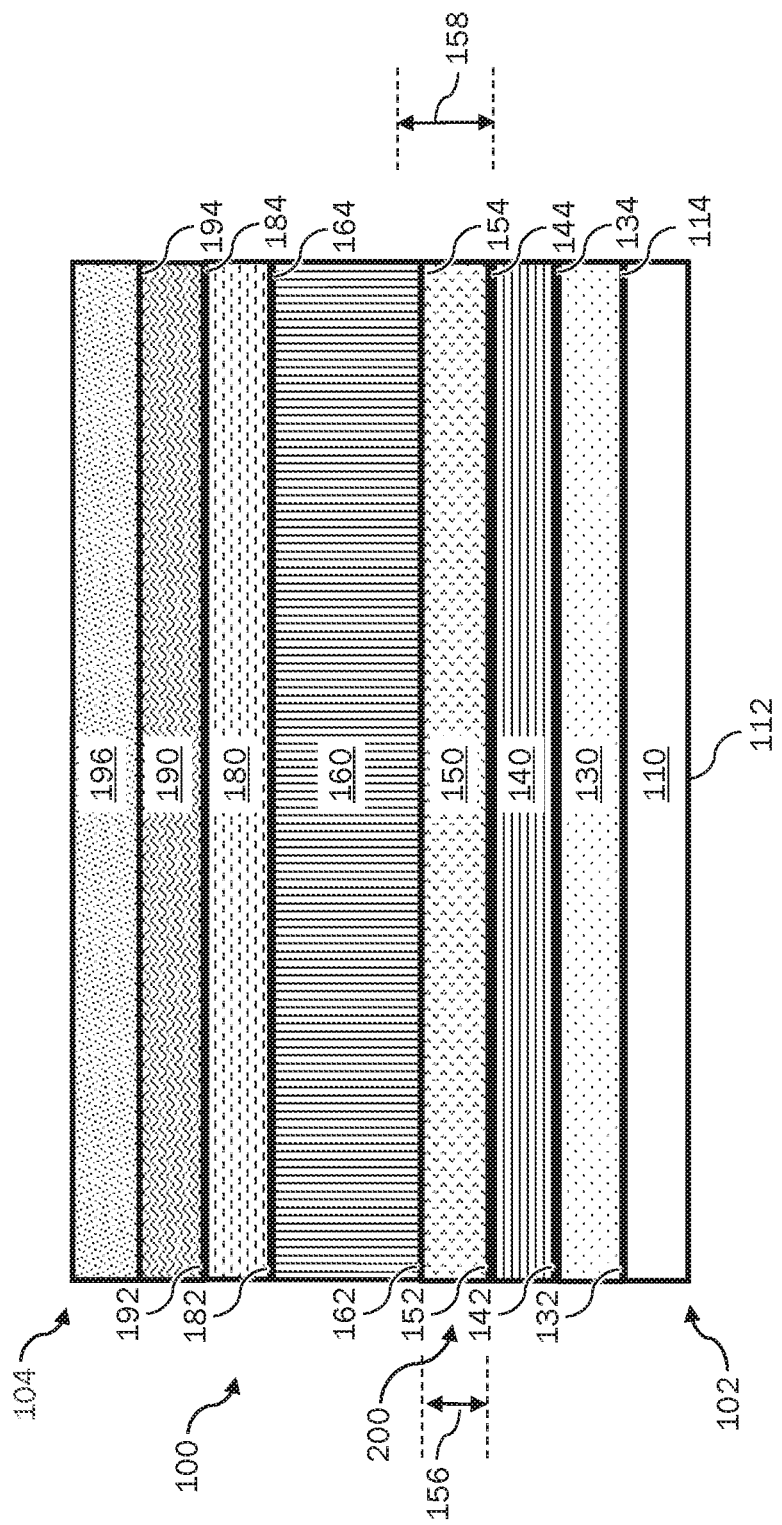
FIG. 1 schematically depicts a cross-sectional view of a photovoltaic device according to one or more embodiments shown and described herein.

Referring now to FIG. 1, an embodiment of a photovoltaic device 100 is schematically depicted. The photovoltaic device 100 can be configured to receive light and transform light into electrical signals, e.g., photons can be absorbed from the light and transformed into electrical signals via the photovoltaic effect. Accordingly, the photovoltaic device 100 can define an energy side 102 configured to be exposed to a light source such as, for example, the sun. The photovoltaic device 100 can also define an opposing side 104 offset from the energy side 102 such as, for example, by a plurality of material layers. It is noted that the term "light" can refer to various wavelengths of the electromagnetic spectrum such as, but not limited to, wavelengths in the ultraviolet (UV), infrared (IR), and visible portions of the electromagnetic spectrum. "Sunlight," as used herein, refers to light emitted by the sun. The photovoltaic device 100 can include a plurality of layers disposed between the energy side 102 and the opposing side 104. As used herein, the term "layer" refers to a thickness of material provided upon a surface. Each layer can cover all (i.e., a continuous layer) or any portion (i.e., a discontinuous layer) of the surface. For example, a continuous layer can be substantially uninterrupted, and a discontinuous layer can have one or more voids formed through the layer occupied by a different material.

Figure 2:
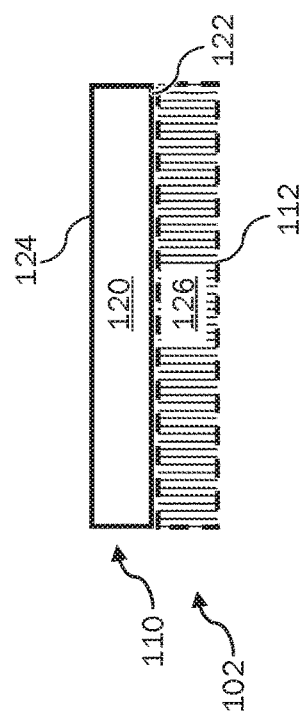
FIG. 2 schematically depicts a substrate according to one or more embodiments shown and described herein.

Referring collectively to FIGS. 1 and 2, the layers of the photovoltaic device 100 can include a substrate 110 configured to facilitate the transmission of light into the photovoltaic device 100. The substrate 110 can be disposed at the energy side 102 of the photovoltaic device 100. The substrate 110 can have a first surface 112 substantially facing the energy side 102 of the photovoltaic device 100 and a second surface 114 substantially facing the opposing side 104 of the photovoltaic device 100. One or more layers of material can be disposed between the first surface 112 and the second surface 114 of the substrate 110.

The substrate 110 can include a transparent layer 120 having a first surface 122 substantially facing the energy side 102 of the photovoltaic device 100 and a second surface 124 substantially facing the opposing side 104 of the photovoltaic device 100. In some embodiments, the second surface 124 of the transparent layer 120 can form the second surface 114 of the substrate 110. The transparent layer 120 can be formed from a substantially transparent material such as, for example, glass. Suitable glass can include soda-lime glass, or any glass with reduced iron content. The transparent layer 120 can have any suitable transmittance, including about 250 nm to about 1,300 nm in some embodiments, or about 250 nm to about 950 nm in other embodiments. The transparent layer 120 may also have any suitable transmission percentage, including, for example, more than about 50% in one embodiment, more than about 60% in another embodiment, more than about 70% in yet another embodiment, more than about 80% in a further embodiment, or more than about 85% in still a further embodiment. In one embodiment, transparent layer 120 can be formed from a glass with about 90% transmittance, or more. Optionally, the substrate 110 can include a coating 126 applied to the first surface 122 of the transparent layer 120. The coating 126 can be configured to interact with light or to improve durability of the substrate 110 such as, but not limited to, an antireflective coating, an antisoiling coating, or a combination thereof.

Referring again to FIG. 1, the photovoltaic device 100 can include a barrier layer 130 configured to mitigate diffusion of contaminants (e.g. sodium) from the substrate 110, which could result in degradation or delamination. The barrier layer 130 can have a first surface 132 substantially facing the energy side 102 of the photovoltaic device 100 and a second surface 134 substantially facing the opposing side 104 of the photovoltaic device 100. In some embodiments, the barrier layer 130 can be provided adjacent to the substrate 110. For example, the first surface 132 of the barrier layer 130 can be provided upon the second surface 114 of the substrate 100. The phrase "adjacent to," as used herein, means that two layers are disposed contiguously and without any intervening materials between at least a portion of the layers.

Generally, the barrier layer 130 can be substantially transparent, thermally stable, with a reduced number of pin holes and having high sodium-blocking capability, and good adhesive properties. Alternatively or additionally, the barrier layer 130 can be configured to apply color suppression to light. The barrier layer 130 can include one or more layers of suitable material, including, but not limited to, tin oxide, silicon dioxide, aluminum-doped silicon oxide, silicon oxide, silicon nitride, or aluminum oxide. The barrier layer 130 can have any suitable thickness bounded by the first surface 132 and the second surface 134, including, for example, more than about 100 Å in one embodiment, more than about 150 Å in another embodiment, or less than about 200 Å in a further embodiment.

Referring still to FIG. 2, the photovoltaic device 100 can include a transparent conductive oxide (TCO) layer 140 configured to provide electrical contact to transport charge carriers generated by the photovoltaic device 100. The TCO layer 140 can have a first surface 142 substantially facing the energy side 102 of the photovoltaic device 100 and a second surface 144 substantially facing the opposing side 104 of the photovoltaic device 100. In some embodiments, the TCO layer 140 can be provided adjacent to the barrier layer 130. For example, the first surface 142 of the TCO layer 140 can be provided upon the second surface 134 of the barrier layer 130. Generally, the TCO layer 140 can be formed from one or more layers of n-type semiconductor material that is substantially transparent and has a wide band gap. Specifically, the wide band gap can have a larger energy value compared to the energy of the photons of the light, which can mitigate undesired absorption of light. The TCO layer 140 can include one or more layers of suitable material, including, but not limited to, tin oxide, fluorine doped tin oxide (e.g., $F:SnO$, $F:SnO_2$, or $F:SnO_x$), indium tin oxide, or cadmium stannate.

The photovoltaic device 100 can include a buffer layer 150 configured to provide a less conductive layer between the TCO layer 140 and any adjacent semiconductor layers. The buffer layer 150 can have a first surface 152 substantially facing the energy side 102 of the photovoltaic device 100 and a second surface 154 substantially facing the opposing side 104 of the photovoltaic device 100. In some embodiments, the buffer layer 150 can be provided adjacent to the TCO layer 140. For example, the first surface 152 of the buffer layer 150 can be provided upon the second surface 144 of the TCO layer 140. The buffer layer 140 may include material having higher resistivity than the TCO later 140, including, but not limited to, intrinsic tin oxide ($SnO$, $SnO_2$, or $SnO_x$), magnesium oxide (MgO), zinc magnesium oxide (e.g., $Zn_{1-x}Mg_xO$), silicon dioxide ($SiO_2$), manganese oxide ($MnO_x$), silicon nitride ($SiN_x$), or any combination thereof. As used herein, manganese oxide ($MnO_x$) includes a compound of manganese and oxygen where the manganese is present in any suitable oxidation state. In some embodiments, the x of $MnO_x$ can be in greater than or equal to about 1 such as, but not limited to, greater than or equal to about 1 and less than or equal to about 2. Accordingly, exemplary $MnO_x$ compounds include, but are not limited to, MnO (corresponding to x=1), $MnO_2$ (corresponding to x=2), $Mn_2O_3$ (corresponding to x=1.5), or $Mn_3O_4$ (corresponding to x=1.3). The exemplary $MnO_x$ compounds can be present as a single phase or as a mixture of multiple phases, which can each be present with or with or without some amorphous component of Mn and O.

In some embodiments, the material of the buffer layer 140 can be configured to substantially match the band gap of an adjacent semiconductor layer (e.g., an absorber). The buffer layer 150 may have a thickness 156 between the first surface 152 and the second surface 154. The thickness 156 can span any suitable distance, including, for example, more than about 0.5 Nanometer (nm) in one embodiment, between about 1 nm and about 200 nm in another embodiment, between about 1 nm and about 100 nm in another embodiment, or between about 1 nm and about 10 nm in a further embodiment, or between about 1 nm and about 3 nm in still a further embodiment. In some embodiments, the buffer layer 150 or layers thereof can be discontinuous. For example, the buffer layer 150 can include a layer of $MnO_x$, which is substantially discontinuous. When the layer of $MnO_x$ is discontinuous, the layer of $MnO_x$ can be characterized using Inductively Coupled Plasma-Optical Emission Spectroscopy (ICP-OES). Specifically, the layer of $MnO_x$ can have a dosage of Mn that is at least about 0.05 µg/cm² such as, for example, greater than or equal to about 0.05 µg/cm² and less than or equal to about 15 µg/cm² in one embodiment, greater than or equal to about 0.1 µg/cm² and less than or equal to about 12 µg/cm² in another embodiment, or greater than or equal to about 0.2 µg/cm² and less than or equal to about 6 µg/cm² in a further embodiment.

Figure 3:
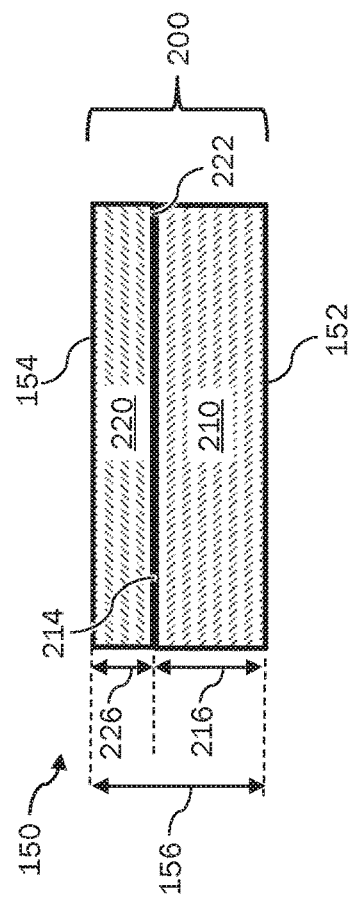
FIG. 3 schematically depicts a buffer layer according to one or more embodiments shown and described herein.

Referring collectively to FIGS. 1 and 3, the buffer layer 150 can comprise a plurality of layers 200. Specifically, the plurality of layers 200 of the buffer layer 150 can comprise a base layer 210 that is disposed at the first surface 152 of the buffer layer 150. Accordingly, the base layer 210 can be provided adjacent to the TCO layer 140. In some embodiments, the first surface 152 of the buffer layer 150 can be a surface of the base layer 210. The base layer 210 can have a second surface 214 substantially facing the opposing side 104 of the photovoltaic device 100. The base layer 210 can have a thickness 216 between the first surface 152 and the second surface 214. In some embodiments, the thickness 216 of the base layer 210 can be span a majority of the thickness 156 of the buffer layer 150.

The plurality of layers 200 of the buffer layer 150 can comprise an interface layer 220 that is disposed at the second surface 154 of the buffer layer 150. Generally, the interface layer 220 can be located further away from the energy side 102 of the photovoltaic device relative to the base layer 210. The interface layer 220 can have a first surface 224 substantially facing the energy side 102 of the photovoltaic device 100. In some embodiments, the second surface 154 of the buffer layer 150 can be a surface of the interface layer 220. The interface layer 220 can have a thickness 226 between the first surface 222 and the second surface 154. In some embodiments, the thickness 226 of the interface layer 220 can be smaller than the thickness 216 of the base layer 210.

According to the embodiments provided herein, the base layer 210 and the interface layer 220 can be composed of different materials. For example, in some embodiments, the base layer 210 can comprise tin oxide (SnO, $SnO_2$, or $SnO_x$), and the interface layer 220 can comprise one of magnesium oxide (MgO), zinc magnesium oxide (e.g., $Zn_{1-x}Mg_xO$), silicon dioxide ($SiO_2$), manganese oxide ($MnO_x$), and silicon nitride ($SiN_x$).

Figure 4:
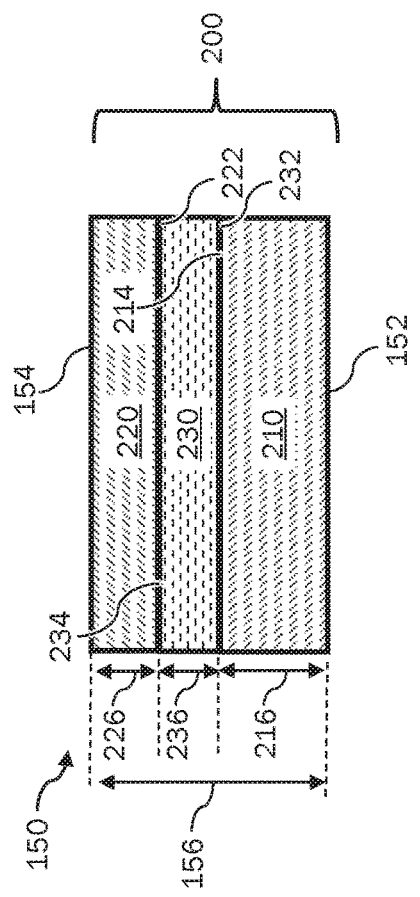
FIG. 4 schematically depicts a buffer layer according to one or more embodiments shown and described herein.

Referring collectively to FIGS. 1 and 4, the plurality of layers 200 of the buffer layer 150 can comprise one or more intermediate layers 230 disposed between the base layer 210 and the interface layer 220. The one or more intermediate layers 230 can have a first surface 232 substantially facing the energy side 102 of the photovoltaic device 100 and a second surface 234 substantially facing the opposing side 104 of the photovoltaic device 100. The one or more intermediate layers 230 can be provided adjacent to the base layer 210 and the interface layer 220. Accordingly, the first surface 232 of the one or more intermediate layers 230 can be provided upon the second surface 214 of the base layer 210 and the second surface 234 of the one or more intermediate layers 230 can be provided upon the first surface 224 of the interface layer 210. The one or more intermediate layers 230 can have a thickness 236 between the first surface 232 and the second surface 234. In some embodiments, the thickness 236 of the one or more intermediate layers 230 can be smaller than the thickness 216 of the base layer 210.

According to the embodiments of the present disclosure, the one or more intermediate layers 230 can be composed of different materials than the base layer 210 and the interface layer 220. For example, in some embodiments, the one or more intermediate layers 230 can comprise zinc magnesium oxide (e.g., $Zn_{1-x}Mg_xO$).

Referring again to FIG. 1, the photovoltaic device 100 can include an absorber layer 160 configured to cooperate with another layer and form a p-n junction within the photovoltaic device 100. Accordingly, absorbed photons of the light can free electron-hole pairs and generate carrier flow, which can yield electrical power. The absorber layer 160 can have a first surface 162 substantially facing the energy side 102 of the photovoltaic device 100 and a second surface 164 substantially facing the opposing side 104 of the photovoltaic device 100. A thickness of the absorber layer 160 can be defined between the first surface 162 and the second surface 164. The thickness of the absorber layer 160 can be between about 0.5 µm to about 10 µm such as, for example, between about 1 µm to about 7 µm in one embodiment, or between about 1.5 µm to about 4 µm in another embodiment.

According to the embodiments described herein, the absorber layer 160 can be formed from a p-type semiconductor material having an excess of positive charge carriers, i.e., holes or acceptors. The absorber layer 160 can include any suitable p-type semiconductor material such as group II-VI semiconductors. Specific examples include, but are not limited to, semiconductor materials comprising cadmium, tellurium, selenium, or any combination thereof. Suitable examples include, but are not limited to, ternaries of cadmium, selenium and tellurium (e.g., $CdSe_xTe_{1-x}$), or a compound comprising cadmium, selenium, tellurium, and one or more additional element.

In embodiments where the absorber layer 160 comprises tellurium and cadmium, the atomic percent of the tellurium can be greater than or equal to about 25 atomic percent and less than or equal to about 50 atomic percent such as, for example, greater than about 30 atomic percent and less than about 50 atomic percent in one embodiment, greater than about 40 atomic percent and less than about 50 atomic percent in a further embodiment, or greater than about 47 atomic percent and less than about 50 atomic percent in yet another embodiment. Alternatively or additionally, the atomic percent of the tellurium in the absorber layer 160 can be greater than about 45 atomic percent such as, for example, greater than about 49% in one embodiment. It is noted that the atomic percent described herein is representative of the entirety of the absorber layer 160, the atomic percentage of material at a particular location within the absorber layer 160 can vary with thickness compared to the overall composition of the absorber layer 160.

In embodiments where the absorber layer 160 comprises selenium and tellurium, the atomic percent of the selenium in the absorber layer 160 can be greater than about 0 atomic percent and less or equal to than about 25 atomic percent such as, for example, greater than about 1 atomic percent and less than about 20 atomic percent in one embodiment, greater than about 1 atomic percent and less than about 15 atomic percent in another embodiment, or greater than about 1 atomic percent and less than about 8 atomic percent in a further embodiment. It is noted that the concentration of tellurium, selenium, or both can vary through the thickness of the absorber layer 160. For example, when the absorber layer 160 comprises a compound including selenium at a mole fraction of x and tellurium at a mole fraction of 1-x ($Se_xTe_{1-x}$), x can vary in the absorber layer 160 with distance from the first surface 162 of the absorber layer 160.

Referring still to FIG. 1, the absorber layer 160 can be doped with a dopant configured to manipulate the charge carrier concentration. In some embodiments, the absorber layer 160 can be doped with a group I or V dopant such as, for example, copper, arsenic, phosphorous, antimony, or a combination thereof. The total density of the dopant within the absorber layer 160 can be controlled. In some embodiments, the absorber layer 160 can have an average concentration of a single group V dopant of at least about $1\times10^{16}$ atoms/$cm^3$ such as for example, at least about $5\times10^{16}$ atoms/$cm^3$ in one embodiment, between about $9\times10^{16}$ atoms/$cm^3$ and about $7\times10^{18}$ atoms/$cm^3$ in another embodiment, or between about $1\times10^{17}$ atoms/$cm^3$ and about $4\times10^{18}$ atoms/$cm^3$ in a further embodiment. Alternatively or additionally, in some embodiments, the peak concentration of the group V dopant within the absorber layer 160 can be at least about $1\times10^{16}$ atoms/$cm^3$. Alternatively or additionally, the amount of the dopant can vary with distance from the first surface 162 of the absorber layer 160.

According to the embodiments provided herein, the p-n junction can be formed by providing the absorber layer 160 sufficiently close to a portion of the photovoltaic device 100 having an excess of negative charge carriers, i.e., electrons or donors. In some embodiments, the absorber layer 160 can be provided adjacent to n-type semiconductor material. Alternatively, one or more intervening layers can be provided between the absorber layer 160 and n-type semiconductor material. In some embodiments, the absorber layer 160 can be provided adjacent to the buffer layer 150. For example, the first surface 162 of the absorber layer 160 can be provided upon the second surface 154 of the buffer layer 150.

The photovoltaic device 100 can include a back contact layer 180 configured to mitigate undesired alteration of the dopant and to provide electrical contact to the absorber layer 160. The back contact layer 180 can have a first surface 182 substantially facing the energy side 102 of the photovoltaic device 100 and a second surface 184 substantially facing the opposing side 104 of the photovoltaic device 100. A thickness of the back contact layer 180 can be defined between the first surface 182 and the second surface 184. The thickness of the back contact layer 180 can be between about 5 nm to about 200 nm such as, for example, between about 10 nm to about 50 nm in one embodiment.

In some embodiments, the back contact layer 180 can be provided adjacent to the absorber layer 160. For example, the first surface 182 of the back contact layer 180 can be provided upon the second surface 164 of the absorber layer 160. In some embodiments, the back contact layer 180 can include binary or ternary combinations of materials from groups I, II, VI, such as for example, one or more layers containing zinc, copper, cadmium and tellurium in various compositions. Further exemplary materials include, but are not limited to, zinc telluride doped with copper telluride, or zinc telluride alloyed with copper telluride.

The photovoltaic device 100 can include a conducting layer 190 configured to provide electrical contact with the absorber layer 160. The conducting layer 190 can have a first surface 192 substantially facing the energy side 102 of the photovoltaic device 100 and a second surface 194 substantially facing the opposing side 104 of the photovoltaic device 100. In some embodiments, the conducting layer 190 can be provided adjacent to the back contact layer 180. For example, the first surface 192 of the conducting layer 190 can be provided upon the second surface 184 of the back contact layer 180. The conducting layer 190 can include any suitable conducting material such as, for example, one or more layers of nitrogen-containing metal, silver, nickel, copper, aluminum, titanium, palladium, chrome, molybdenum, gold, or the like. Suitable examples of a nitrogen-containing metal layer can include aluminum nitride, nickel nitride, titanium nitride, tungsten nitride, selenium nitride, tantalum nitride, or vanadium nitride.

The photovoltaic device 100 can include a back support 196 configured to cooperate with the substrate 110 to form a housing for the photovoltaic device 100. The back support 196 can be disposed at the opposing side 102 of the photovoltaic device 100. For example, the back support 196 can be formed adjacent to the conducting layer 190. The back support 196 can include any suitable material, including, for example, glass (e.g., soda-lime glass).

Figure 5:
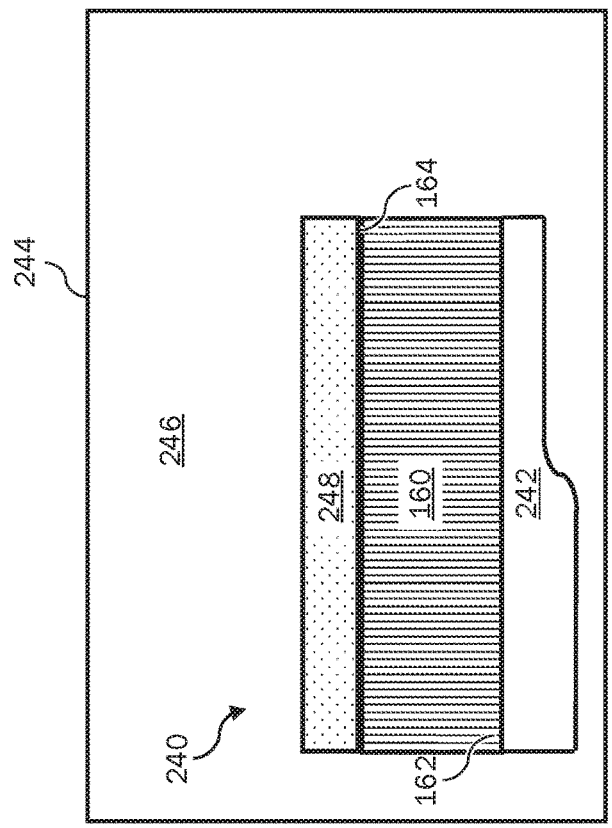
FIG. 5 schematically depicts a process for annealing a layer stack according to one or more embodiments shown and described herein.

Referring collectively to FIGS. 1 and 5, manufacturing of the photovoltaic device 100 generally includes sequentially disposing functional layers or layer precursors in a "stack" of layers through one or more thin film deposition processes, including, but not limited to, sputtering, spray, evaporation, molecular beam deposition, pyrolysis, closed space sublimation (CSS), pulse laser deposition (PLD), chemical vapor deposition (CVD), electrochemical deposition (ECD), atomic layer deposition (ALD), or vapor transport deposition (VTD). In some embodiments, a partially formed photovoltaic device 240 can be subjected to an annealing process to improve the functioning of the absorber layer 160. For example, the partially formed photovoltaic device 240 can comprise the absorber layer 160 adjacent to a layer stack 204. The layer stack 204 can include one or more of the layers of the photovoltaic device 100 disposed between the absorber layer 160 and the energy side 102.

The partially formed photovoltaic device 240 can be annealed within a processing chamber 244 that provides a reduced ambient environment 246, i.e., an environments having less than 500 parts per million of oxygen. During the annealing process, the absorber layer 160 can be contacted with an annealing compound 248 that comprises cadmium chloride ($CdCl_2$). Generally, the annealing process includes heating the absorber layer 160 (e.g., polycrystalline semiconductor material) for sufficient time and temperature to facilitate re-crystallization of the absorber layer 160. Additionally, the heating, the reduced ambient environment 246 and annealing compound 248 can cooperate to facilitate grain growth in the absorber layer 160 and activation of group V dopants such as, for example, nitrogen (N), phosphorous (P), arsenic (As), antimony (Sb), bismuth (Bi), or a combination thereof. In some embodiments, the oxidation state of compounds (e.g., $MnO_x$) in the buffer layer 150 can change during the annealing process. Specifically, before annealing, the $MnO_x$ can be present as, for example, $MnO_2$ (corresponding to x=2), $M_3O_4$ (corresponding to x=1.3), or a combination thereof. Alternatively or additionally, before annealing, the $MnO_x$ can include an amorphous component of Mn and O. After annealing, the at least a portion of the $MnO_x$ can change oxidation state, which can be evidenced by the presence of a different $MnO_x$ compound.

In some instances, the buffer layer 150 can also be doped with the group V dopant. For example, the group V dopant can diffuse into the buffer layer 150. Accordingly in some embodiments, the peak concentration of the group V dopant within the buffer layer 150 can be at least about $1 \times 10^{16}$ atoms/cm$^3$. Thus, a layer of $MnO_x$ can comprise the Group V dopant. In alternative embodiments, one or more of the layers of the buffer layer 150 can be free of the group V dopant, i.e., diffusion can be mitigated.

An interface region 158 can include the interface of the first surface 162 of the absorber layer 160 and the second surface 154 of the buffer layer 150. For example, the interface region 158 can start from the first surface 152 of the buffer layer 150 and extend into the absorber layer 160. The interface region 158 can have a thickness of less than or equal to about 500 nm such as, for example, be between about 0.5 nm and 500 nm in one embodiment, or between about 1 nm and 100 nm in another embodiment. Applicant has discovered that when subjected to the annealing process, the buffer layer 150 performs in an unexpected manner. Without being bound to theory, it is believed that the chemical nature of the buffer layer 150 and the absorber layer 160 can lead to undesired defects within the interface region 158. Many chemical compositions can be more prone to defects such as, for example, during dopant activation in the reduced ambient environment 246. Such defects can decrease efficiency of the photovoltaic device 100.

Efficiency of the photovoltaic device 100 can be improved by including a layer of $MnO_x$ within the buffer layer 150. For example, the layer of $MnO_x$ adjacent to the first surface 162 of the absorber layer 160 or sufficiently close to the first surface 162 of the absorber layer 160. That is one or more of the plurality of layers 200 of the buffer layer can be interposed between the layer of $MnO_x$ and the to the first surface 162 of the absorber layer 160. Accordingly, the layer of $MnO_x$ can be within about 200 nm of the first surface 162 of the absorber layer 160 such as, for example, less than about 100 nm in one embodiment, less than about 80 nm in another embodiment, less than about 35 Tim in yet another embodiment, of less than about 15 nm in a further embodiment.

EXAMPLES

Comparative Example: a film stack was prepared over a glass substrate. The film stack included a TCO layer of fluorine doped tin oxide formed over the glass substrate, a buffer layer of tin oxide formed over the TCO layer, and an absorber layer of As:CdSeTe. The stack was annealed with an annealing compound that comprised cadmium chloride ($CdCl_2$) in a reduced ambient environment.

Examples: Example 1 was formed in the same manner as the Comparative Example with the buffer layer modified to have a base layer of tin oxide and an interface layer of $Zn_{1-x}Mg_xO$. Example 2 was formed in the same manner as the Comparative Example with the buffer layer modified to have a base layer of tin oxide and an interface layer of $SiO_2$. Example 3 was formed in the same manner as the Comparative Example with the buffer layer modified to have a base layer of tin oxide, an intermediate layer of $Zn_{1-x}Mg_xO$, and an interface layer of $SiO_2$. Example 4 was formed in the same manner as the Comparative Example with the buffer layer modified to have a base layer of tin oxide and an interface layer of $MnO_x$. Example 5 was formed in the same manner as the Comparative Example with the buffer layer modified to have a base layer of $Zn_{1-x}Mg_xO$, and an interface layer of $SiO_2$. Multiple samples of the Comparative Example and the Examples were prepared and characterized using Secondary-Ion Mass Spectrometry (SIMS).

TABLE 1

| | Buffer Layer | Thickness (nm) | Average As concentration in Absorber (atoms/cm$^3$) |
|---|---|---|---|
| Comparative Example | $SnO_2$ | 40 | $3 \times 10^{17}$ to $2 \times 10^{19}$ |
| Example 1 | $SnO_2$/ZMO | 40/15 to 25 | $3 \times 10^{17}$ to $2 \times 10^{19}$ |
| Example 2 | $SnO_2$/$SiO_2$ | 40/1 to 1.5 | $3 \times 10^{17}$ to $2 \times 10^{19}$ |
| Example 3 | $SnO_2$/ZMO/$SiO_2$ | 40/15 to 25/1 to 1.5 | $3 \times 10^{17}$ to $2 \times 10^{19}$ |
| Example 4 | $SnO_2$/$MnO_x$ | 40/1 to 3 | $3 \times 10^{17}$ to $2 \times 10^{19}$ |
| Example 5 | ZMO/$SiO_2$ | 15 to 25/1 to 1.5 | $3 \times 10^{17}$ to $2 \times 10^{19}$ |

Figure 6:
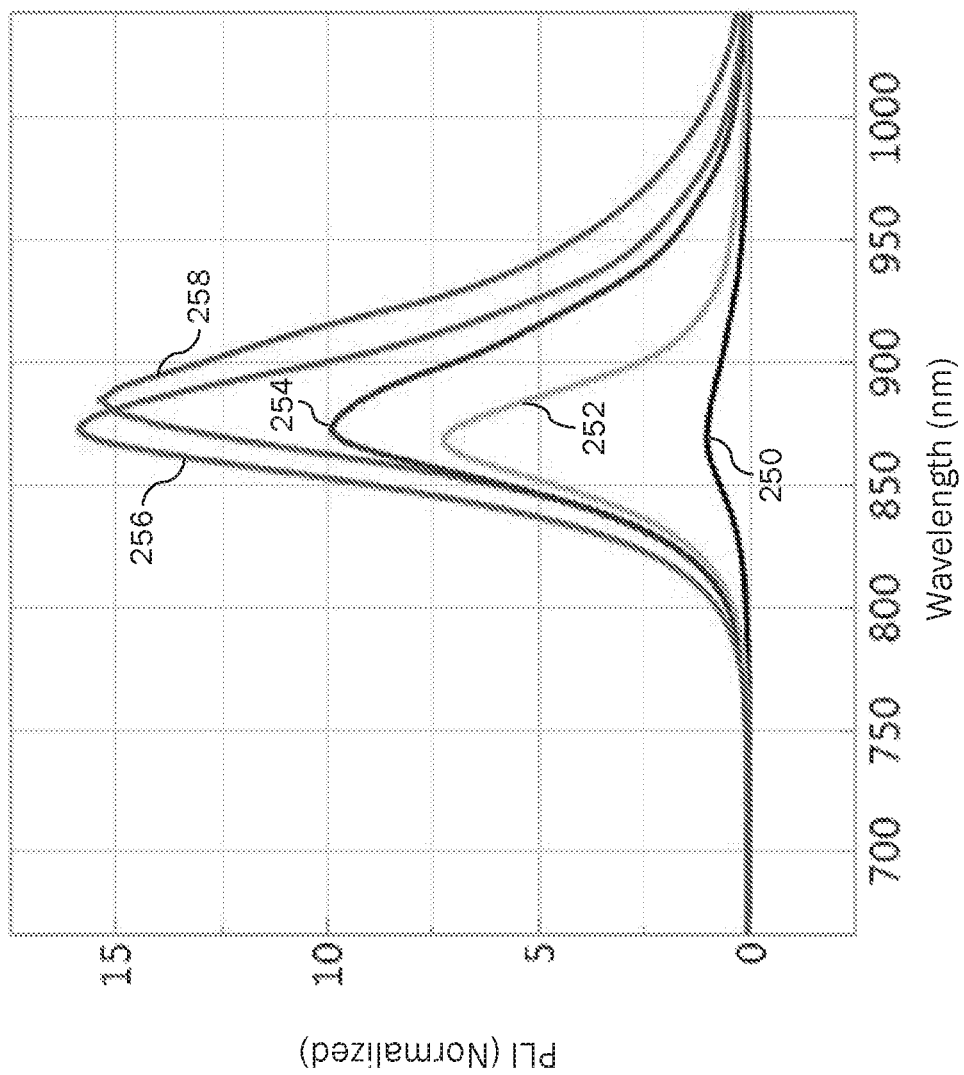
FIG. 6 graphically depicts normalized photoluminescence spectra according to one or more embodiments shown and described herein.

Referring collectively to FIGS. 1 and 6, photoluminescence spectroscopy was utilized to characterize recombination at the interface of the buffer layer and the absorber layer of Comparative Example and Examples 1-4. Generally, a higher intensity of luminescence in response to light injected into the energy side 102 (FIG. 1) can correspond to less carrier recombination at interface of the buffer layer and the absorber layer. Accordingly, a higher intensity can correspond to higher efficiency of the photovoltaic device 100.

The photoluminescence intensities (PLI) for the Comparative Example and Examples 1-4 are depicted in FIG. 6. Specifically, PLI spectrum 250 corresponds to the Comparative Example, PLI spectrum 252 corresponds to Example 1, PLI spectrum 254 corresponds to Example 2, PLI spectrum 256 corresponds to Example 3, and PLI spectrum 258 corresponds to Example 4. Each of the spectra 250, 252, 254, 256, 258 are normalized to the peak value of the PLI spectrum 250. PLI spectrum 252, PLI spectrum 254, PLI spectrum 256, and PLI spectrum 258 demonstrate increased performance of Examples 1-4 relative to the Comparative Example. Specifically, PLI spectrum 252 corresponds to an improvement in peak intensity of about 700% for Example 1 relative to the Comparative Example. PLI spectrum 254 corresponds to an improvement in peak intensity of about 1,000% for Example 2 relative to the Comparative Example. PLI spectra 256, 258 correspond to an improvement in peak intensity of about 1,500% for Examples 3 and 4 relative to the Comparative Example. Further testing demonstrated a similar performance improvement for Example 5 as depicted for Example 3.

Various instances of Example 4 were analyzed using X-ray diffraction (XRD) to determine the composition of the buffer layer 150 before and after the annealing process. In one instance, the buffer layer 150 included $Mn_3O_4$ before the annealing process and included MnO and $Mn_3O_4$ after the annealing process. In another instance, the buffer layer 150 included $Mn_2O_3$ before the annealing process and included $Mn_3O_4$ after the annealing process. In a further instance, the buffer layer 150 included $MnO_2$ and $Mn_3O_4$ before the annealing process and included $Mn_3O_4$ (without $MnO_2$) after the annealing process. In still a further instance, the buffer layer 150 included $MnO_2$ before the annealing process and included $MnO_2$ and $Mn_3O_4$ after the annealing process.

According to the embodiments provided herein, a photovoltaic device can include an absorber layer disposed over a buffer layer. The absorber layer can have a first surface and a second surface. The absorber layer the absorber layer can include cadmium and tellurium. The absorber layer can be doped with a group V dopant. The buffer layer can include a layer of MnOx.

According to the embodiments provided herein, method for annealing a partially formed photovoltaic device can include contacting the absorber layer with an annealing compound that includes cadmium chloride. The partially formed photovoltaic device can include an absorber layer disposed over a buffer layer. The absorber layer can include cadmium and tellurium. The buffer layer can include a layer of $MnO_x$. The method can include heating the absorber layer for sufficient time and temperature to facilitate re-crystallization of the absorber layer. The method can include diffusing a group V dopant through the absorber layer and into the buffer layer.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:
1. A photovoltaic device comprising:
   a substrate;
   a transparent conductive oxide layer over the substrate;
   a buffer layer residing over the transparent conductive oxide layer, the buffer layer including:
   a first buffer layer comprising a discontinuous first layer including $MnO_x$ and a void formed through the discontinuous first layer occupied by a material other than MnOx; and
   a second buffer layer;

an absorber layer over the buffer layer, the absorber layer including a group V dopant, and the absorber layer having a first and second surface; and a back contact layer over the absorber layer.

2. The photovoltaic device of claim 1, wherein the first buffer layer includes a group V dopant.

3. The photovoltaic device of claim 1, wherein the first buffer layer is adjacent to the absorber layer.

4. The photovoltaic device of claim 1, wherein the discontinuous first layer of $MnO_x$ has a bandgap that substantially matches the bandgap of an adjacent semiconductor.

5. The photovoltaic device of claim 1, further comprising a barrier layer between the substrate and the transparent conductive oxide layer.

6. The photovoltaic device of claim 5, further comprising a conducting layer on top of the back contact layer.

7. The photovoltaic device of claim 6, further comprising a back support on top of the conducting layer.

8. The photovoltaic device of claim 1, wherein the layer of $MnO_x$ comprises $MnO_2$ or $Mn_2O_3$.

9. The photovoltaic device of claim 1, wherein the layer of $MnO_x$ comprises $Mn_3O_4$.

10. The photovoltaic device of claim 1, wherein the discontinuous first layer of $MnO_x$ has a dosage of Mn that is at least 0.05 μg/cm$^2$.

11. The photovoltaic device of claim 1, wherein the buffer layer further includes a third buffer layer including tin oxide and the second buffer layer includes a different material than the third buffer layer.

12. The photovoltaic device of claim 11, wherein the buffer layer is adjacent to the absorber layer.

13. The photovoltaic device of claim 12, wherein the second buffer layer includes magnesium oxide.

14. The photovoltaic device of claim 12, wherein the second buffer layer includes zinc magnesium oxide.

15. The photovoltaic device of claim 12, wherein the second buffer layer includes silicon dioxide.

16. The photovoltaic device of claim 12, wherein the second buffer layer includes $MnO_x$.

17. The photovoltaic device of claim 12, wherein the second buffer layer includes silicon nitride.

18. The photovoltaic device of claim 12, wherein the third buffer layer is thicker than the second buffer layer.

19. The photovoltaic device of claim 1, wherein:
the buffer layer further comprises at least one intermediate layer between the first buffer layer and the second buffer layer; and
the at least one intermediate layer is composed of a different material than both the first buffer layer and the second buffer layer.

20. The photovoltaic device of claim 19, wherein the second buffer layer is thicker than the at least one intermediate buffer layer.

21. The photovoltaic device of claim 19, wherein the at least one intermediate buffer layer includes zinc magnesium oxide.

22. The photovoltaic device of claim 21, wherein the second buffer layer includes silicon dioxide.

23. A photovoltaic device comprising:
a substrate;
a transparent conductive oxide over the substrate;
a buffer layer including two layers with one of the two layers being a discontinuous layer including $MnO_x$ having a void formed through the discontinuous layer occupied by a material other than MnOx and the buffer layer residing over the transparent conductive oxide;
an absorber layer, residing over the buffer layer, the absorber layer including a group V dopant, and the absorber layer having a first and second surface;
a back contact layer over the absorber layer; and
a conducting layer over the back contact layer.

24. A photovoltaic device comprising:
a substrate;
a transparent conductive oxide layer over the substrate;
a buffer layer including two layers with one of the two layers being a discontinuous layer including $MnO_x$ having a void formed through the discontinuous layer occupied by a material other than MnOx and the buffer layer residing over the transparent conductive oxide;
an absorber layer over the buffer layer, the absorber layer including a group V dopant, and the absorber layer having a first and second surface;
a back contact layer over the absorber layer;
a conducting layer over the back contact layer; and
a back support over the conducting layer.

* * * * *